US008418972B2

(12) United States Patent
Iizuka et al.

(10) Patent No.: US 8,418,972 B2
(45) Date of Patent: Apr. 16, 2013

(54) ATTACHMENT DEVICE

(75) Inventors: Koji Iizuka, Shinagawa (JP); Akio Nakamura, Shinagawa (JP)

(73) Assignee: Fujitsu Component Limited, Tokyo (JP)

( * ) Notice: Subject to any disclaimer, the term of this patent is extended or adjusted under 35 U.S.C. 154(b) by 27 days.

(21) Appl. No.: 13/067,852

(22) Filed: Jun. 29, 2011

(65) Prior Publication Data
US 2012/0001034 A1 Jan. 5, 2012

(30) Foreign Application Priority Data

Jun. 30, 2010 (JP) ................................. 2010-149576

(51) Int. Cl.
*F16L 3/00* (2006.01)

(52) U.S. Cl.
USPC .............................................. 248/49; 248/73

(58) Field of Classification Search ................. 248/27.1, 248/27.3, 73, 49; 312/223.1, 265.1–265.4, 312/334.5; 211/26, 262, 190–192, 182; 361/679.39
See application file for complete search history.

(56) References Cited

U.S. PATENT DOCUMENTS

| 6,741,452 | B1 * | 5/2004 | Liu et al. ........................ 361/631 |
| 6,853,549 | B2 * | 2/2005 | Xu ............................ 361/679.39 |
| 7,255,409 | B2 * | 8/2007 | Hu et al. ..................... 312/334.4 |
| 7,878,468 | B2 * | 2/2011 | Chen et al. ................. 248/220.41 |
| 8,042,777 | B2 * | 10/2011 | Ruiz et al. ...................... 248/235 |
| 8,104,626 | B2 * | 1/2012 | Huang et al. ..................... 211/26 |
| 2003/0071002 | A1 * | 4/2003 | Hung ............................. 211/183 |
| 2005/0052102 | A1 * | 3/2005 | Lauchner ..................... 312/334.5 |
| 2005/0156493 | A1 * | 7/2005 | Yang et al. .................. 312/334.5 |
| 2011/0268411 | A1 * | 11/2011 | Giraud et al. .................. 385/135 |

FOREIGN PATENT DOCUMENTS

| JP | 6-125184 | 5/1994 |
| JP | 2009-104398 | 5/2009 |

OTHER PUBLICATIONS

Patent Abstracts of Japan, Publication No. 2009-104398, Published May 14, 2009.
Patent Abstracts of Japan, Publication No. 06-125184, Published May 6, 1994.

* cited by examiner

*Primary Examiner* — Ramon Ramirez
(74) *Attorney, Agent, or Firm* — Staas & Halsey LLP

(57) ABSTRACT

An attachment device includes: an attachment attachable to a rack; and a bracket attachable to a switch device and engageable with the attachment, and including a hold portion for holding a cable, wherein the attachment attached to the rack is engaged with the bracket attached to the switch device, whereby the switch device is supported by the rack.

4 Claims, 12 Drawing Sheets

ATTACHMENT DEVICE

CROSS-REFERENCE TO RELATED APPLICATION

This application is based upon and claims the benefit of priority of the prior Japanese Patent Application No. 2010-149576, filed on Jun. 30, 2010, the entire contents of which are incorporated herein by reference.

FIELD

A certain aspect of the embodiments discussed herein is related to an attachment device.

BACKGROUND

On a rack which a server is mounted, a device other than a server can be mounted. A console drawer which can be mounted on such a rack is described in Japanese Patent Application Publication No. 2009-104398.

FIGS. 1 and 2 are explanatory views of a conventional method for mounting a switch device on a rack.

Plural ports 14 are provided in a switch device 10.

Brackets 20x and 30x are respectively secured to both sides of the switch device 10.

The brackets 20x and 30x are respectively secured to columns 110 and 120 defining the rack by the use of screws S and nuts N.

Therefore, the switch device 10 is mounted on the rack.

However, the brackets 20x and 30x attached to the switch device 10 are directly secured to the columns 110 and 120 of the rack, respectively.

For this reason, to secure the brackets 20x and 30x to the rack, it is necessary to engage the screw S with the nut N while the switch device 10 is being supported.

In such a method, it is necessary to perform multiple operations at the same time.

It is thus difficult for an operator alone to perform a mounting operation.

Further, devices mounted on such a rack are connected to each other through a cable.

For this reason, the cable may interfere with the device mounted on the rack.

SUMMARY

According to an aspect of the present invention, there is provided an attachment device including: an attachment attachable to a rack; and a bracket attachable to a switch device and engageable with the attachment, and including a hold portion for holding a cable, wherein the attachment attached to the rack is engaged with the bracket attached to the switch device, whereby the switch device is supported by the rack.

The objects and advantages of the invention will be realized and attained by the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
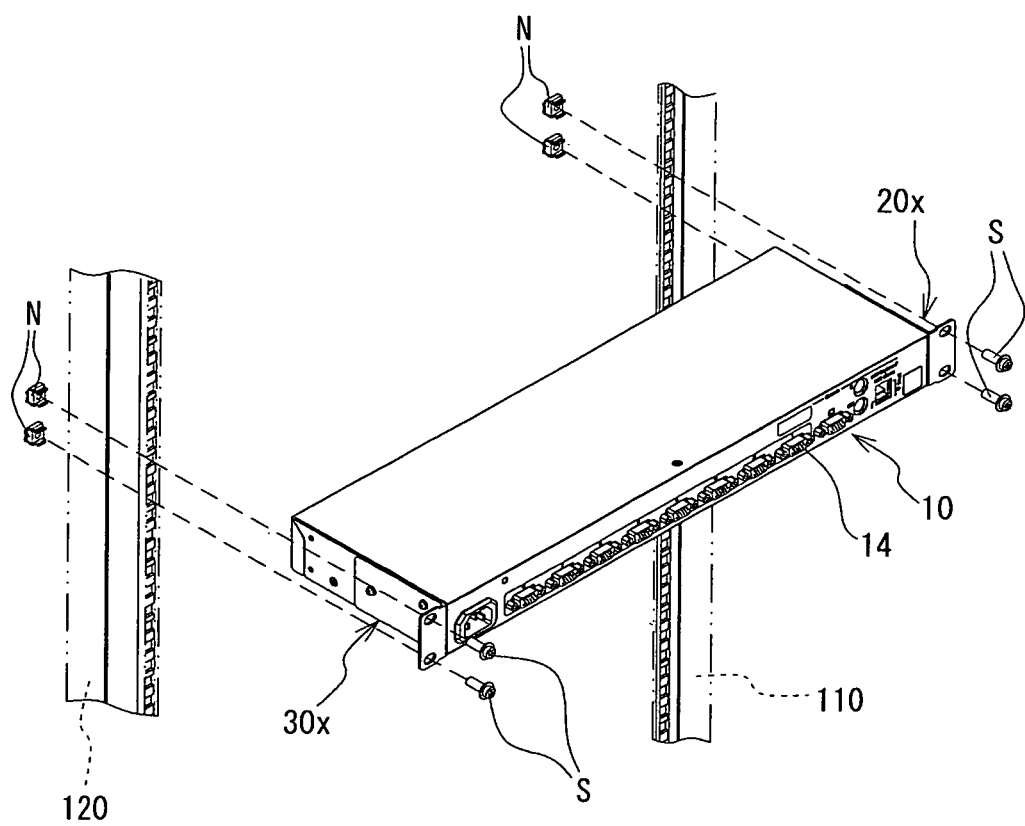
FIG. 1 is an explanatory view of a conventional method for mounting a switch device on a rack.
Figure 2:
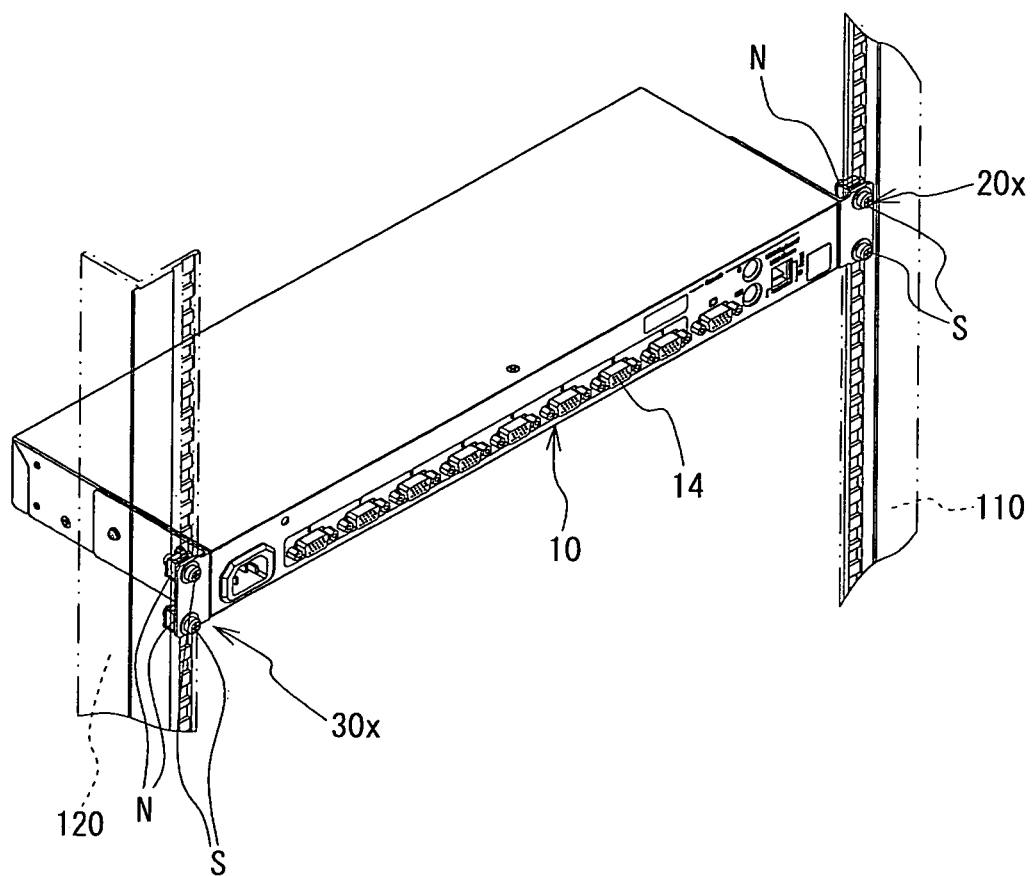
FIG. 2 is an explanatory view of the conventional method for mounting the switch device on the rack.
Figure 3:
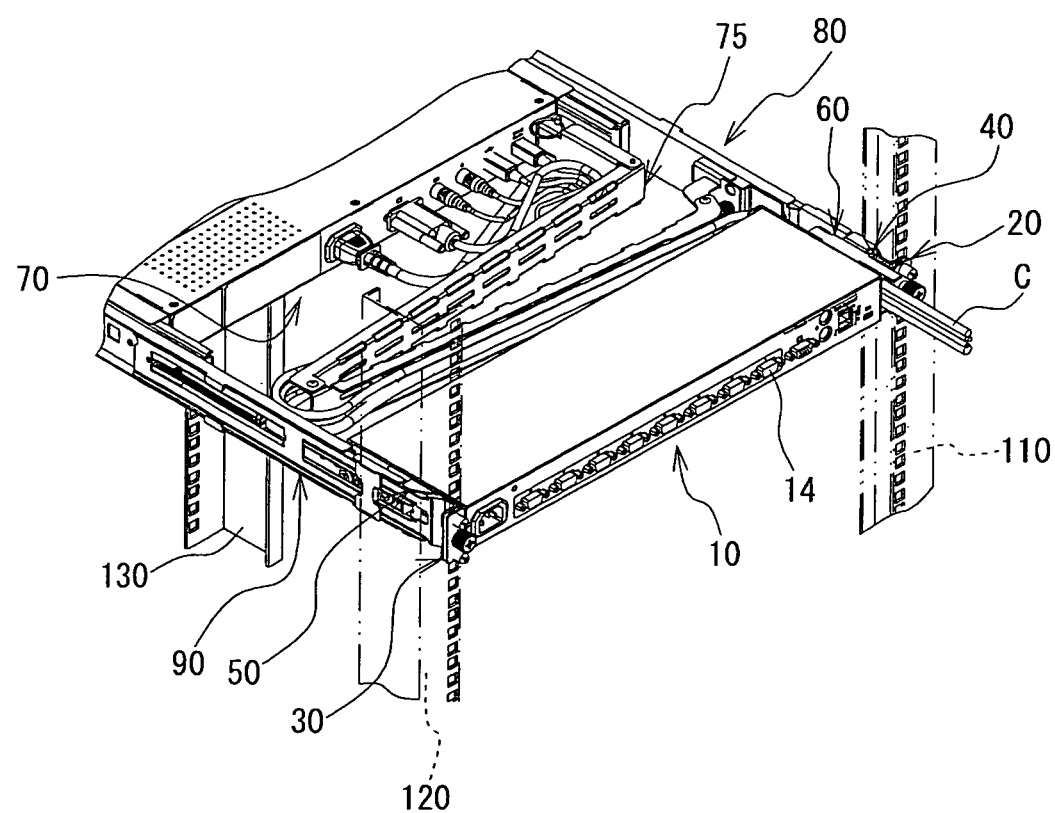
FIG. 3 is an explanatory view of a switch device mounted on the rack by the attachment device according to a present embodiment.

FIG. 3 is an explanatory view of a switch device mounted on a rack by an attachment device according to a present embodiment. The switch device 10 has plural ports 14. A cable can be connected to the port 14. The switch device 10 has a function to switch an object (a server device) which is operated by a console drawer 70. The rack includes columns 110, 120, and 130 and another not illustrated. Plural holes are aligned in the lengthwise direction in each of columns 110, 120, and 130. These holes are used for mounting the device on the rack.

In FIG. 3, the console drawer 70 is mounted on the rack. The console drawer 70 is a drawer type console unit which is integrated with a keyboard, a mouse, a monitor not illustrated, and is used for operating the server device mounted on the rack. The console drawer 70 is mounted on the rack through guide rails 80 and 90. The console drawer 70 is engaged and supported to be capable of sliding on the guide rails 80 and 90.

Plural cables C are connected to a rear side of the console drawer 70. The cables C are connectable to the ports 14 of the switch device 10. Also, a carrier 75 for holding the cables C is connected to the rear side of the console drawer 70. The carrier 75 can expand and contract in response to the movement of the console drawer 70. The console drawer 70 and the switch device 10 are mounted at the same height position. The switch device 10 is mounted at the rear side of the console drawer 70. The switch device 10 is secured to the columns 110 and 120 by brackets 20 and 30 and attachments 40 and 50. The brackets 20 and 30 and the attachments 40 and 50 are each made of metal. A cover 60 covers the cables C.

Figure 4:
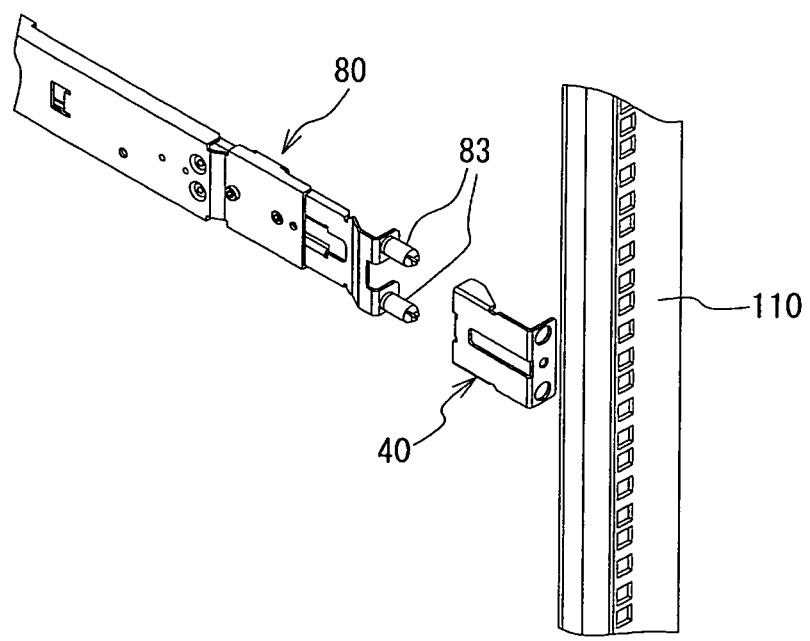
FIG. 4 is an explanatory view of an attachment.
Figure 5:
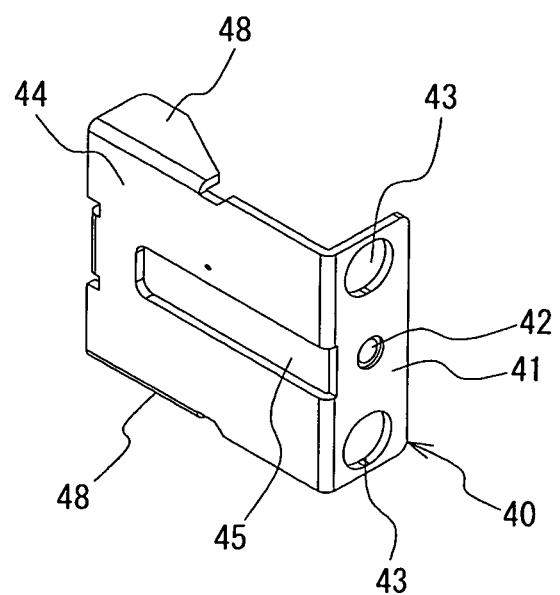
FIG. 5 is an explanatory view of the attachment.

The attachment 40 will be described. FIGS. 4 and 5 are explanatory views of the attachment 40. As illustrated in FIG. 4, the attachment 40 is sandwiched between the guide rail 80 and the column 110 to be attached to the column 110. Two fit pins 83 are formed at an end portion of the guide rail 80. Two fit holes 43 are formed at a front wall 41 of the attachment 40. The fit pins 83 penetrate through the fit holes 43 to fit into the holes of the column 110, whereby the attachment 40 is attached to the column 110.

As illustrated in FIG. 5, the attachment 40 includes: a front wall 41; and a Side wall 44 which is continuous from a side edge of the front wall 41 to extend in the depth direction of the rack substantially perpendicular to the front wall 41. A screw hole 42 is provided between fit holes 43 of the front wall 41. The screw hole 42 will be described later. An engagement slot 45 is formed at a substantially central portion of the side wall 44 to extend in the depth direction of the rack. Sandwiching walls 48 are continuous from each of upper and lower ends of the side wall 44. Two sandwiching walls 48 sandwich the guide rail 80. Additionally, the structure of the attachment 50 is substantially the same as that of the attachment 40. However, the attachments 40 and 50 are respectively attached to the columns 110 and 120 by the guide rails 80 and 90 with attachments 40 and 50 facing oppositely.

Figure 6:
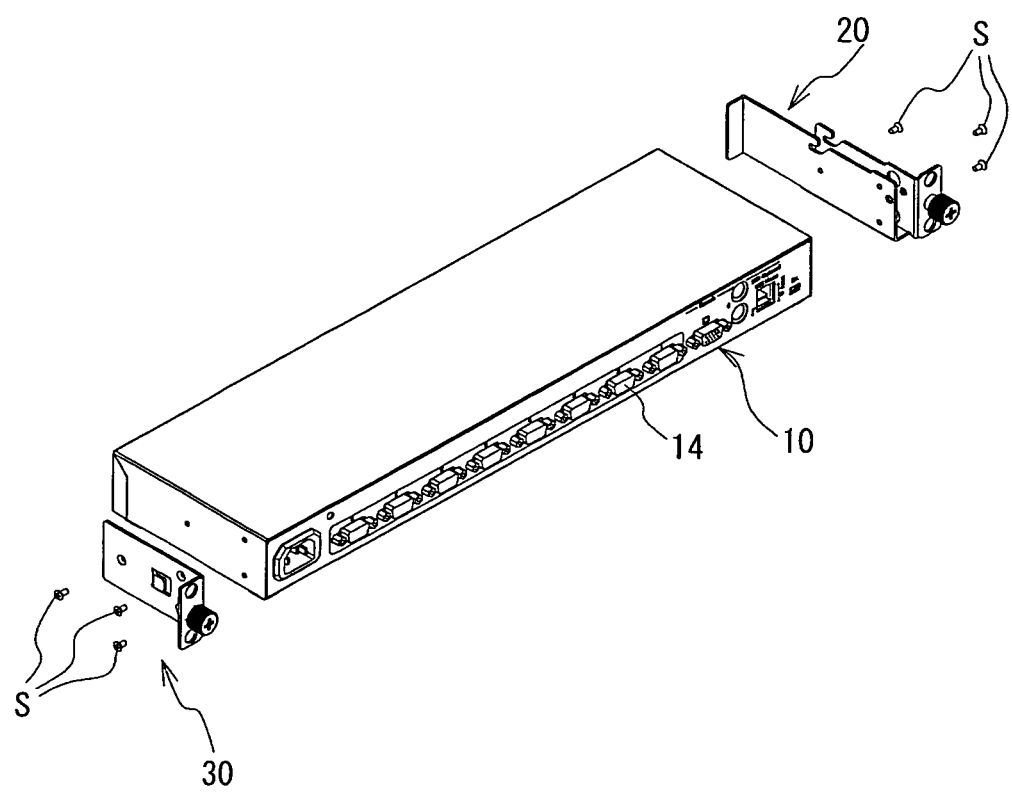
FIG. 6 is an explanatory view of brackets.
Figure 7A:
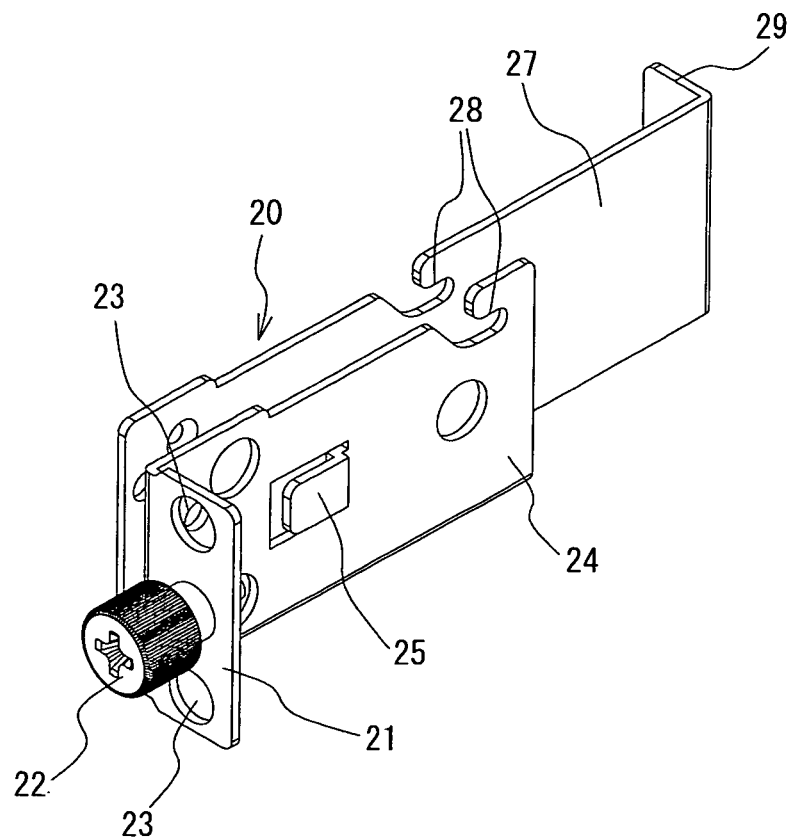
FIGS. 7A and 7B are explanatory views of the bracket.
Figure 7B:
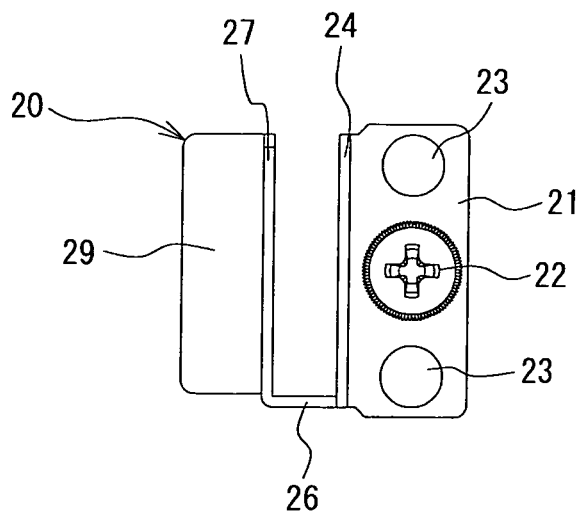

The brackets 20 and 30 will be described. FIGS. 6, 7A, 7B, and 8 are explanatory views of the brackets 20 and 30. As illustrated in FIG. 6, the brackets 20 and 30 are respectively attached to the right and left side surfaces of the switch device 10 by plural screws S. As illustrated in FIGS. 7A and 7B, the bracket 20 includes a front wall 21, a side wall 24, a bottom wall 26, and a rear end wall 29. The side wall 24 is continuous from a side edge of the front wall 21 to extend in the depth direction of the rack substantially perpendicular to the front wall 21. The bottom wall 26 is continuous from the lower end of the side wall 24 substantially parallel with the horizontal plane. A side wall 27 is continuous from a side edge of the bottom wall 26 substantially parallel with the side wall 24. The side wall 27 is formed to be longer than the side wall 24. The side wall 27 abuts the right side surface of the switch device 10. The rear end wall 29 is continuous from a rear end portion of the side wall 27 substantially Perpendicular to the side wall 27.

Fit holes 23 into which fit pins 83 of the guide rail 80 are inserted are formed at the front wall 21. A locking screw 22 is supported between the fit holes 23. The locking screw 22 is rotatably supported by the front wall 21. Also, an engagement projection 25 is provided at a substantially central portion of the side wall 24, as illustrated in FIG. 7A. The engagement projection 25 protrudes to the opposite side of the switch device 10. Further, notches 28 are respectively formed at the upper ends of the side walls 24 and 27, as illustrated in FIG. 7A. The notches 28 can engage the cover 60. The rear end wall 29 supports the rear surface of the switch device 10 when the bracket 20 is attached to the switch device 10. front wall 21, a side wall 24, a bottom wall 26, and a rear end wall 29. The side wall 24 is continuous from a side edge of the front wall 21 to extend in the depth direction of the rack in substantially perpendicular to the front wall 21. The bottom wall 26 is continuous from the lower end of the side wall 24 in substantially parallel with the horizontal plane. A side wall 27 is continuous from a side edge of the bottom wall 26 in substantially parallel with the side wall 24. The side wall 27 is formed to be longer than the side wall 24. The side wall 27 abuts the right side surface of the switch device 10. The rear end wall 29 is continuous from a rear end portion of the side wall 27 in substantially perpendicular to the side wall 27.

Fit holes 23 into which the fit pins 83 of the guide rail 80 are inserted are formed at the front wall 21. A locking screw 22 is supported between the fit holes 23. The locking screw 22 is rotatably supported by the front wall 21. Also, an engagement projection 25 is provided at a substantially central portion of the side wall 24, as illustrated in FIG. 7A. The engagement projection 25 protrudes to the opposite side of the switch device 10. Further, notches 28 are respectively formed at the upper ends of the side walls 24 and 27, as illustrated in FIG. 7A. The notches 28 can engage the cover 60. The rear end wall 29 supports the rear surface of the switch device 10 when the bracket 20 is attached to the switch device 10.

When the switch device 10 is viewed from its front side, the whole of the side wall 24, the bottom wall 26, and the side wall 27 has a substantial U shape, as illustrated in FIG. 7B. The cables C are held in the space defined by the side wall 24, the bottom wall 26, and the side wall 27. Thus, the side wall 24, the bottom wall 26, and the side wall 27 function as a hold portion for holding the cables C.

Figure 8:
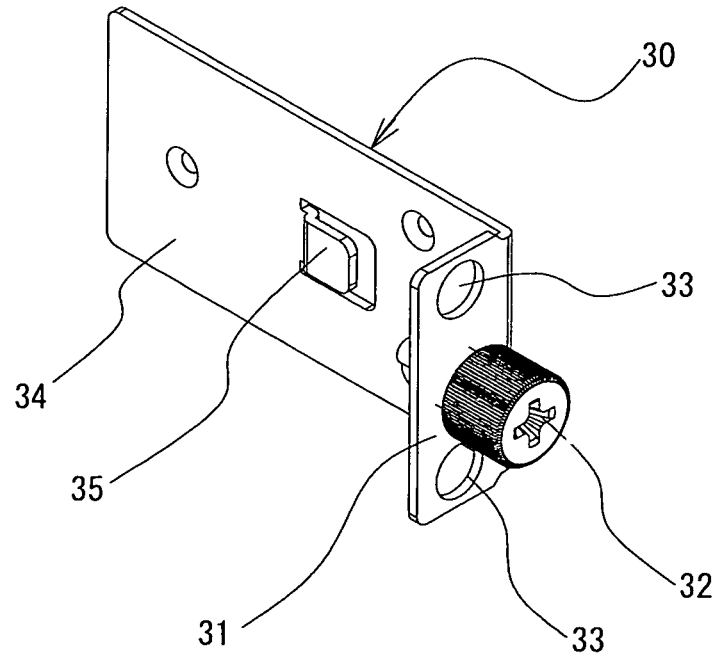
FIG. 8 is an explanatory view of the bracket.

As illustrated in FIG. 8, the bracket 30 includes a front wall 31 and a side wall 34. The side wall 34 is continuous from a side edge of the front wall 31 to extend substantially perpendicular to the front wall 31. The side wall 34 extends in the horizontal direction. An engagement projection 35 is provided at a substantially central portion of the side wall 34. The engagement projection 35 protrudes on the opposite side of the switch device 10. The bracket 30 does not have a function for holding the cables C.

Figure 9A:
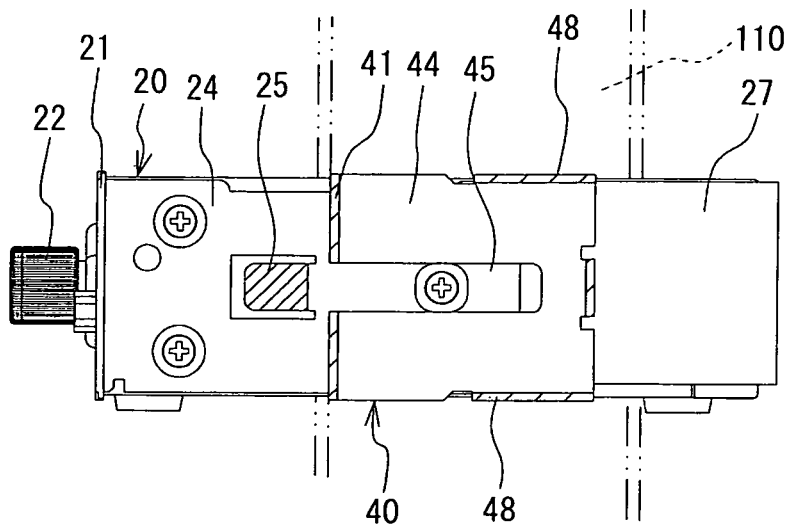
FIGS. 9A and 9B are explanatory views of an engagement of the bracket with the attachment.
Figure 9B:
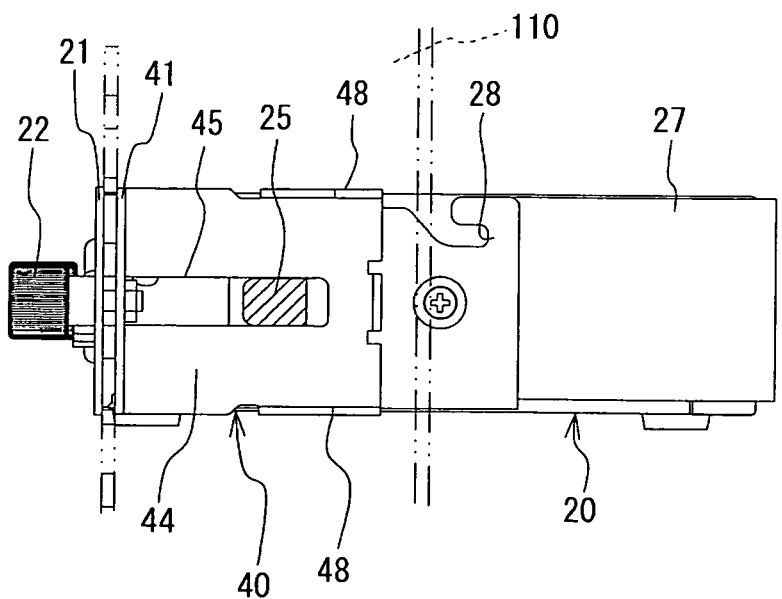

The engagement of the bracket 20 with the attachment 40 will de described. FIGS. 9A and 9B are explanatory views of the engagement of the bracket 20 with the attachment 40. Additionally, FIG. 9A illustrates a section of the attachment 40 to facilitate understanding. The attachments 40 and 50 are attached beforehand to the columns 110 and 120 respectively, and the brackets 20 and 30 are attached to the switch device 10. In this state, the engagement projection 25 is engaged with the engaging slot 45, and the engagement projection 35 is engaged with the engagement slot of the attachment 50. The switch device 10 is supported by the columns 110 and 120 through the brackets 20 and 30 and the attachments 40 and 50. More particularly, the switch device 10 is inserted into the rear side of the rack, whereby the engagement projection 25 is guided from one end of the engaging slot 45 to the other end thereof. Also, the engagement projection 35 is guided from the one end of the engaging slot of the attachment 50 to the other end thereof. The switch device 10 is inserted into the rear side of the rack, whereby the front wall 21 of the bracket 20 faces the front wall 41 of the attachment 40 and the front wall 31 of the bracket 30 faces the front wall of the attachment 50. When the locking screws 22 and 32 are made to turn in this state, they threadedly engage the threaded hole 42 formed at the front wall 41. Likewise, the locking screw 32 threadedly engages the threaded hole of the attachment 50.

This locks the engagement of the bracket 20 with the attachment 40 and the engagement of the bracket 30 with the attachment 50. Therefore, the switch device 10 is mounted on the rack. Such an engaging slot 45 has a function to guide the bracket 20 to the position where the bracket 20 and the attachment 40 are lockable to each other. Likewise, the engaging slot of the attachment 50 has a function to guide the bracket 30 to the position where the bracket 30 and the attachment 50 are lockable to each other.

In this way, the operator engages the attachments 40 and 50, respectively attached to the columns 110 and 120, with the brackets 20 and 30, attached to the switch device 10, whereby the switch device 10 can be temporarily supported by the rack. After that, the switch device 10 is inserted into the rear side of the rack, and then the locking screws 22 and 32 are made to turn. Therefore, the mounting of the switch device 10 on the rack is accomplished. Thus, the above operations are not only performed at the same time but also performed in order. For this reason, even with only one operator, the switch device 10 can be mounted on the rack with ease.

Figure 10:
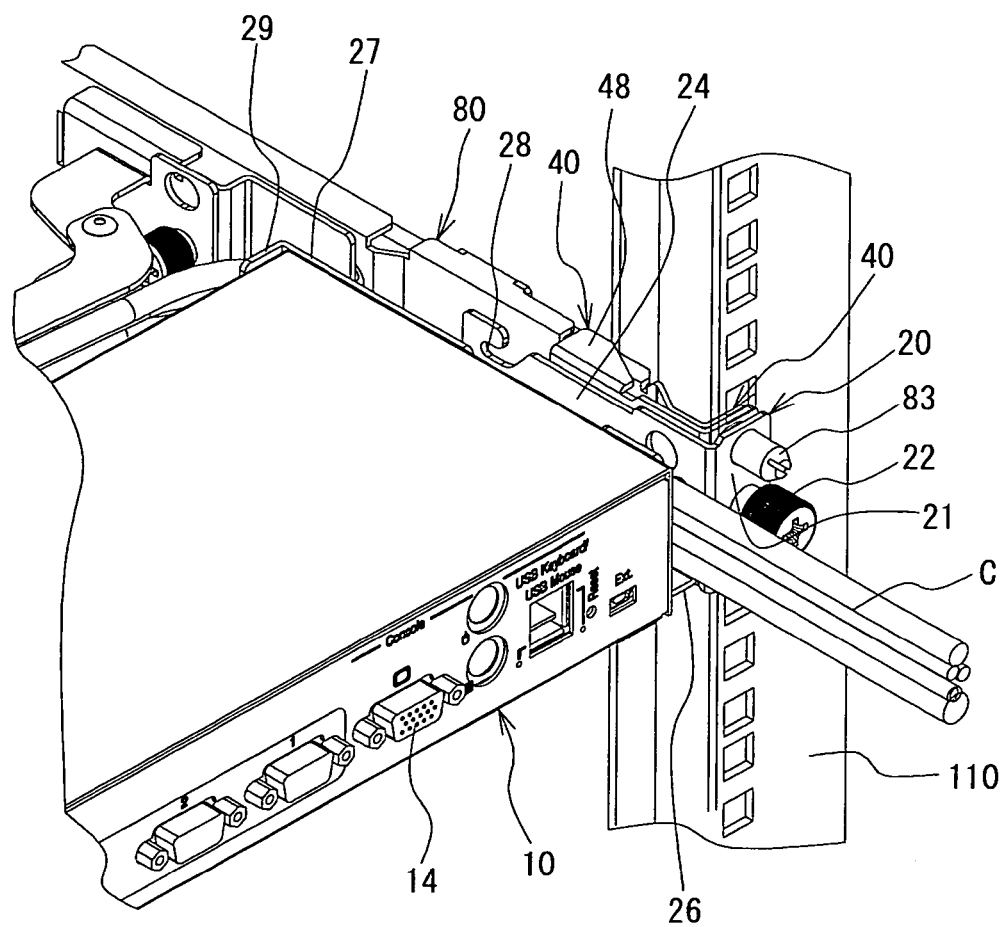
FIG. 10 is an explanatory view of a cover.
Figure 11:
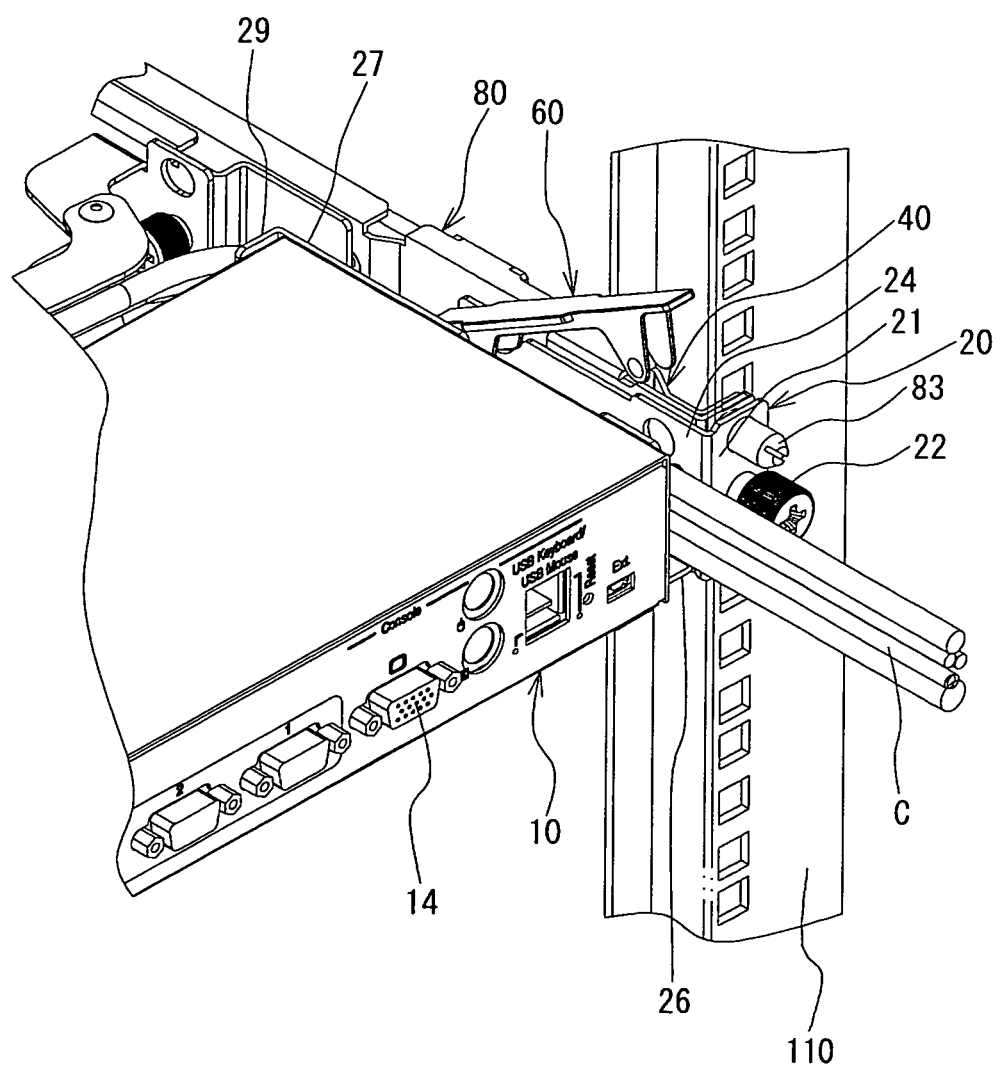
FIG. 11 is an explanatory view of the cover.
Figure 12:
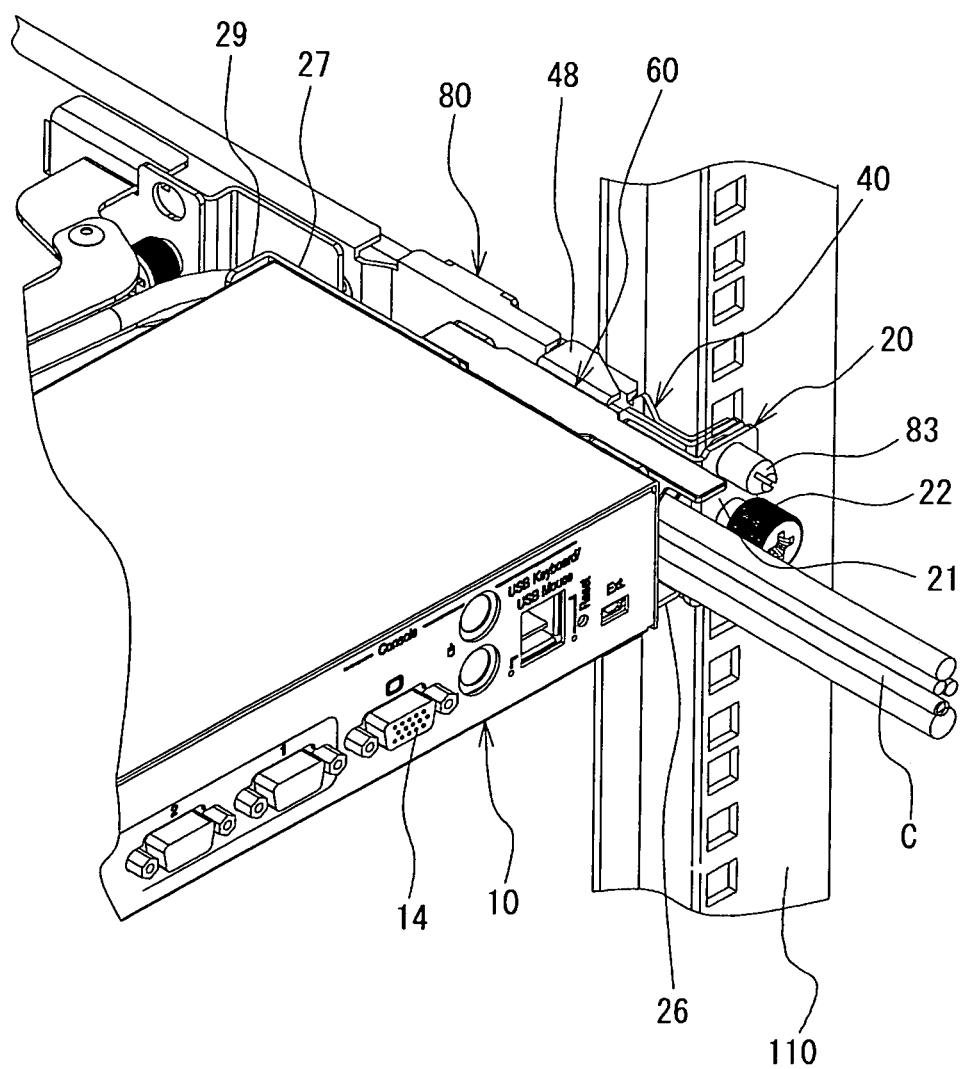
FIG. 12 is an explanatory view of the cover.

The cover 60 will be described. FIGS. 10, 11, and 12 are explanatory views of the cover 60. FIG. 10 illustrates the state immediately after the switch device 10 is mounted on the rack. In this state, the rear end portion of the cover 60 engages the notches 28 of the bracket 20 to cover the upper portion of the cables C, as illustrated in FIG. 11. The cover 60 is rotated about the rear end portion thereof and the front end moves toward the cables C, whereby the cover 60 covers the cables C as illustrated in FIG. 12. Therefore, the cables C are housed in the space defined by the cover 60, the side wall 24, the bottom wall 26, and the side wall 27. Thus, the cables C are prevented from being detached from the space. It is therefore possible to prevent the cables C from interfering with the switch device 10 or other devices mounted on the rack.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. An attachment device comprising:
   an attachment attachable to a rack;
   a bracket attachable to an electronic device and engageable with the attachment, and including a hold portion for holding a cable; and
   a cover preventing the cable from being detached from the hold portion,
   wherein the attachment attached to the rack is engaged with the bracket attached to the electronic device, and
   wherein the electronic device is supported by the rack.

2. The attachment device of claim 1, wherein the hold portion is capable of holding the cable connectable to the electronic device.

3. An attachment device comprising:
   an attachment attachable to a rack; and
   a bracket attachable to an electronic device and engageable with the attachment, and including a hold portion for holding a cable,
   wherein the attachment attached to the rack is engaged with the bracket attached to the electronic device,
   wherein the electronic device is supported by the rack, and
   wherein the bracket supports a locking screw locking the bracket and the attachment.

4. An attachment device comprising:
   an attachment attachable to a rack; and
   a bracket attachable to an electronic device and engageable with the attachment, and including a hold portion for holding a cable,
   wherein the attachment attached to the rack is engaged with the bracket attached to the electronic device,
   wherein the electronic device is supported by the rack, and
   wherein the bracket includes an engagement projection, the attachment includes an engagement slot engageable with the engagement projection, and the engagement slot guides the engagement projection to a position where the attachment and the bracket are lockable to each other.

* * * * *